(12) United States Patent
Park et al.

(10) Patent No.: US 12,334,158 B2
(45) Date of Patent: Jun. 17, 2025

(54) PUMP DISCHARGE SEQUENCE IMPROVEMENTS IN EXTERNAL POWER SUPPLY MODE FOR PULSE RECOVERY PHASES IN NON-VOLATILE MEMORY

(71) Applicant: Intel NDTM US LLC, Santa Clara, CA (US)

(72) Inventors: Soo-yong Park, San Jose, CA (US); Pranav Chava, Folsom, CA (US); Binh Ngo, Folsom, CA (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 658 days.

(21) Appl. No.: 17/545,672

(22) Filed: Dec. 8, 2021

(65) Prior Publication Data

US 2023/0178158 A1 Jun. 8, 2023

(51) Int. Cl.
*G11C 16/30* (2006.01)
*G11C 16/04* (2006.01)
*G11C 16/08* (2006.01)
*G11C 16/10* (2006.01)

(52) U.S. Cl.
CPC .......... *G11C 16/30* (2013.01); *G11C 16/0483* (2013.01); *G11C 16/08* (2013.01); *G11C 16/10* (2013.01)

(58) Field of Classification Search
CPC ...................................... G11C 16/30
See application file for complete search history.

(56) References Cited

U.S. PATENT DOCUMENTS

2017/0163146 A1* 6/2017 Suzuki ................ H02M 3/07
2021/0249092 A1 8/2021 Beshari et al.

OTHER PUBLICATIONS

U.S. Appl. No. 17/033,082, entitled "Progressive Program Suspend Resume," filed on Sep. 25, 2020, 32 pages.
U.S. Appl. No. 17/212,792, entitled "Simultaneous Programming of Multiple Sub-Blocks in NAND Memory Structures," filed on Mar. 25, 2021, 36 pages.
U.S. Appl. No. 17/342,993, entitled "Soft Read Operations with Progressive Data Output," filed on Jun. 9, 2021, 33 pages.
U.S. Appl. No. 17/411,919, entitled "Dynamic Gate Steps For Last-Level Programming to Improve Write Performance," filed on Aug. 25, 2021, 23 pages.

* cited by examiner

*Primary Examiner* — Jason Lappas
(74) *Attorney, Agent, or Firm* — Morgan, Lewis & Bockius LLP

(57) ABSTRACT

Systems, apparatuses and methods may provide for technology that includes a charge pump and applies a program voltage from the charge pump to selected wordlines in the NAND memory. The technology may also conduct a discharge of the program voltage from the charge pump and maintain a connection between the selected wordlines and a pass voltage of the charge pump while the program voltage is being discharged. In one example, the connection between the selected wordlines and the pass voltage prevents the selected wordlines from floating.

20 Claims, 5 Drawing Sheets

PUMP DISCHARGE SEQUENCE IMPROVEMENTS IN EXTERNAL POWER SUPPLY MODE FOR PULSE RECOVERY PHASES IN NON-VOLATILE MEMORY

TECHNICAL FIELD

Embodiments generally relate to memory structures. More particularly, embodiments relate to pump discharge sequence improvements in external power supply mode for pulse recovery phases in non-volatile memory.

BACKGROUND

To program cells in a NAND flash memory, a series of program pulses may be applied from a charge pump to a selected wordline (WL) that corresponds to the page address to be programmed. Each program pulse (e.g., charge pump program voltage, VpgmCP) is typically followed by a set of verify operations to compare the threshold voltage of the cells being programmed against verify voltages (e.g., configurable charge pump pass voltages, VpassCP) that correspond to the level at which each cell is to be programmed. The process of programming and verifying is typically iterative and a program pulse followed by a number of program verify steps may be referred to as a pulse-verify loop.

During the program pulse-to-program verify transition (also referred to as the pulse recovery phase), the wordlines are typically floated (e.g., disconnected from the charge pump pass voltage) to avoid device breakdown (e.g., safe operating area/SOA) violations in the charge pump while VpgmCP discharges. More particularly, the wordlines become floating due to VpgmCP discharge as the VpgmCP output is eventually controlling the pass gate of wordline driver. Therefore, VpgmCP is discharged to avoid device breakdown inside of the configurable VpassCP and the wordlines become floating as the pass gate voltage is also discharging (e.g., the pass gate voltage comes from VpgmCP). This float period may be significant (e.g., 2.5 µs (microseconds)) and may cause both performance downsides (e.g., 2.5 µs per pulse-verify loop) and increased power consumption (e.g., due to unloading and reloading VpassCP for all wordlines).

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

In recent years, vertical memory, such as three-dimensional (3D) memory has been developed. A 3D flash memory (e.g., 3D NAND memory array) device may include a plurality of strings of charge storage devices (memory cells) stacked over one another (e.g., in a first of three dimensions of 3D) with each charge storage device corresponding to one of multiple tiers of the device. The charge storage devices of a respective string may share a common channel region, such as one formed in a respective pillar of semiconductor material (e.g., polysilicon) about which the string of charge storage devices may be formed.

In a second dimension, each first group of the plurality of strings may comprise, for example, a group of strings sharing a plurality of access lines, known as wordlines (WLs). Each of the plurality of access lines may couple (e.g., electrically or otherwise operably connect) the charge storage devices (memory cells) corresponding to a respective tier of the plurality of tiers of each string. The charge storage devices coupled by the same access line (and thus corresponding to the same tier) may be logically grouped into memory pages, where each charge storage device includes a multi-level cell capable of storing two or more bits of information. In a third dimension, each group of the plurality of strings may include a group of strings coupled by corresponding data lines, known as bitlines (BLs).

A charge pump may be used to apply a series of program pulses (e.g., VpgmCP) to a selected wordline (WL) that corresponds to the page address to be programmed, as well as a configurable set of verify voltages (e.g., VpassCP) that correspond to the level at which each cell is to be programmed. As will be discussed in greater detail, technology described herein avoids floating the wordlines during the program pulse-to-program verify transition (e.g., pulse recovery phase) while still avoiding device breakdown (e.g., SOA) violations in the charge pump during the discharge of the charge pump program voltage.

Figure 1:
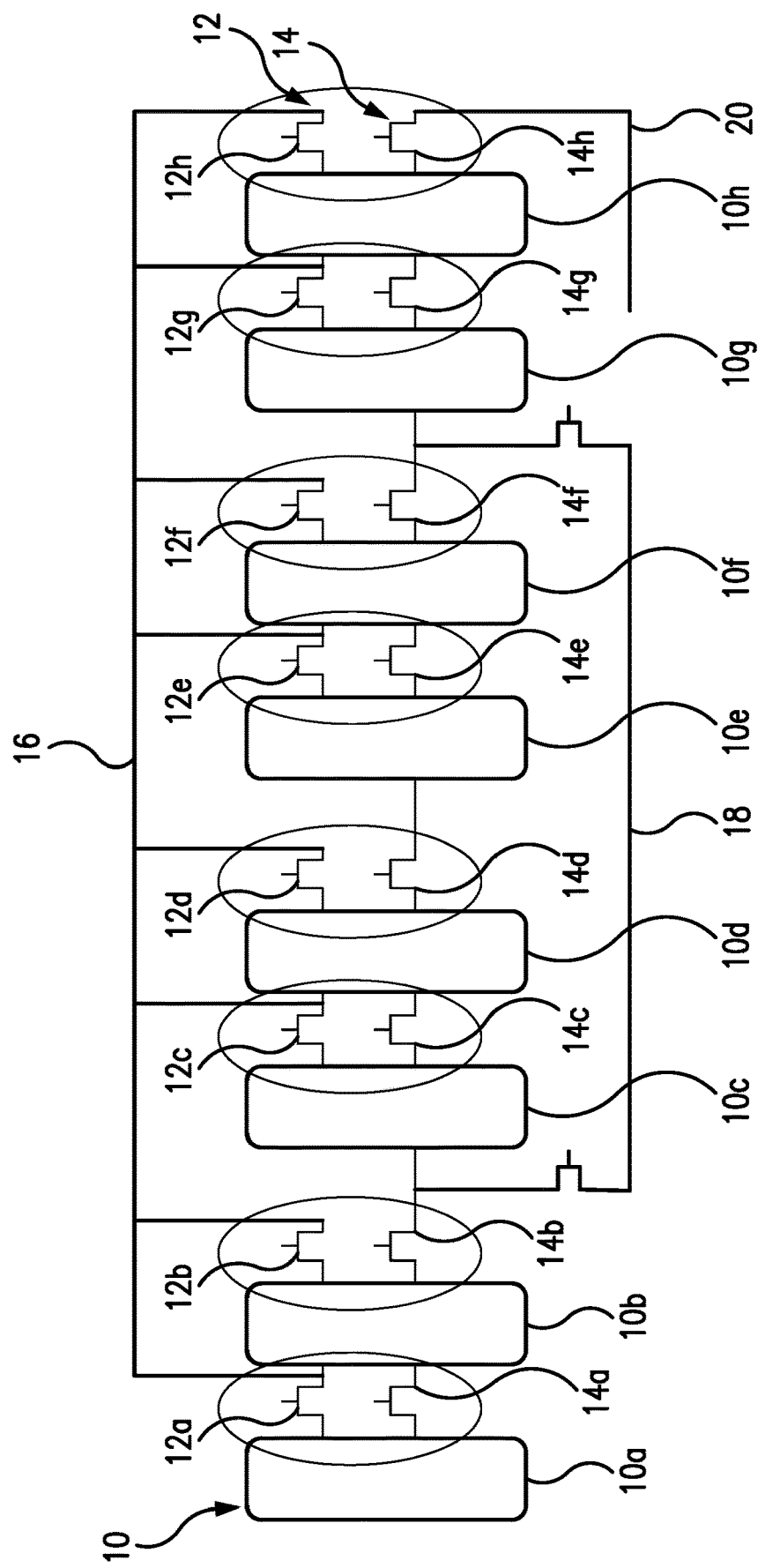
FIG. 1 is a circuit diagram of an example of a charge pump according to an embodiment.

Turning now to FIG. 1, a charge pump 10 (10a-10h) is shown. The charge pump 10 is generally a DC-to-DC (direct current to direct current) converter that includes multiple stages that use capacitors for energetic charge storage to raise or lower voltage. In the illustrated example, the stages of the charge pump 10 are coupled to a first set of high voltage (HV, e.g., 24V (Volts)) switches 12 (12a-12h) that provide a verify (e.g., pass) voltage (VpassCP) on a source line 16 to a set of verify regulators (not shown). The first set of HV switches 12 control the stages of the charge pump 10 in parallel or serial to obtain an appropriate charge strength and high voltage level in the charge pump 10. The stages of the charge pump 10 are also coupled to a second set of HV switches 14 (14a-14h) that are connected to an external supply line 18 (e.g., 12V) and provide a program voltage (VpgmCP) on a source line 20 to a program regulator (not shown).

During the program pulse-to-program verify transition, there is the potential to damage low voltage (LV) devices within the stages of the charge pump 10. Rather than floating the selected wordlines during the pulse recovery phase to protect the LV devices, embodiments maintain a connection between the selected wordlines and the source line 16. Eliminating the float period saves a significant amount of time during programming (e.g., 2.5 µs per pulse-verify loop). Protection is provided to the LV devices within the stages of the charge pump 10 by momentarily reducing the program voltage to a non-zero voltage level (e.g., an intermediate voltage between 24V and ground) during the pulse recovery phase. In an embodiment, the momentary reduction is achieved by setting the non-zero voltage level via a control register that provides a reference voltage to the program regulator coupled to the source line 20. Embodiments also bypass a discharge (e.g., unloading) and charge (reloading) of the pass voltage for all wordlines, which decreases power consumption.

Figure 2:
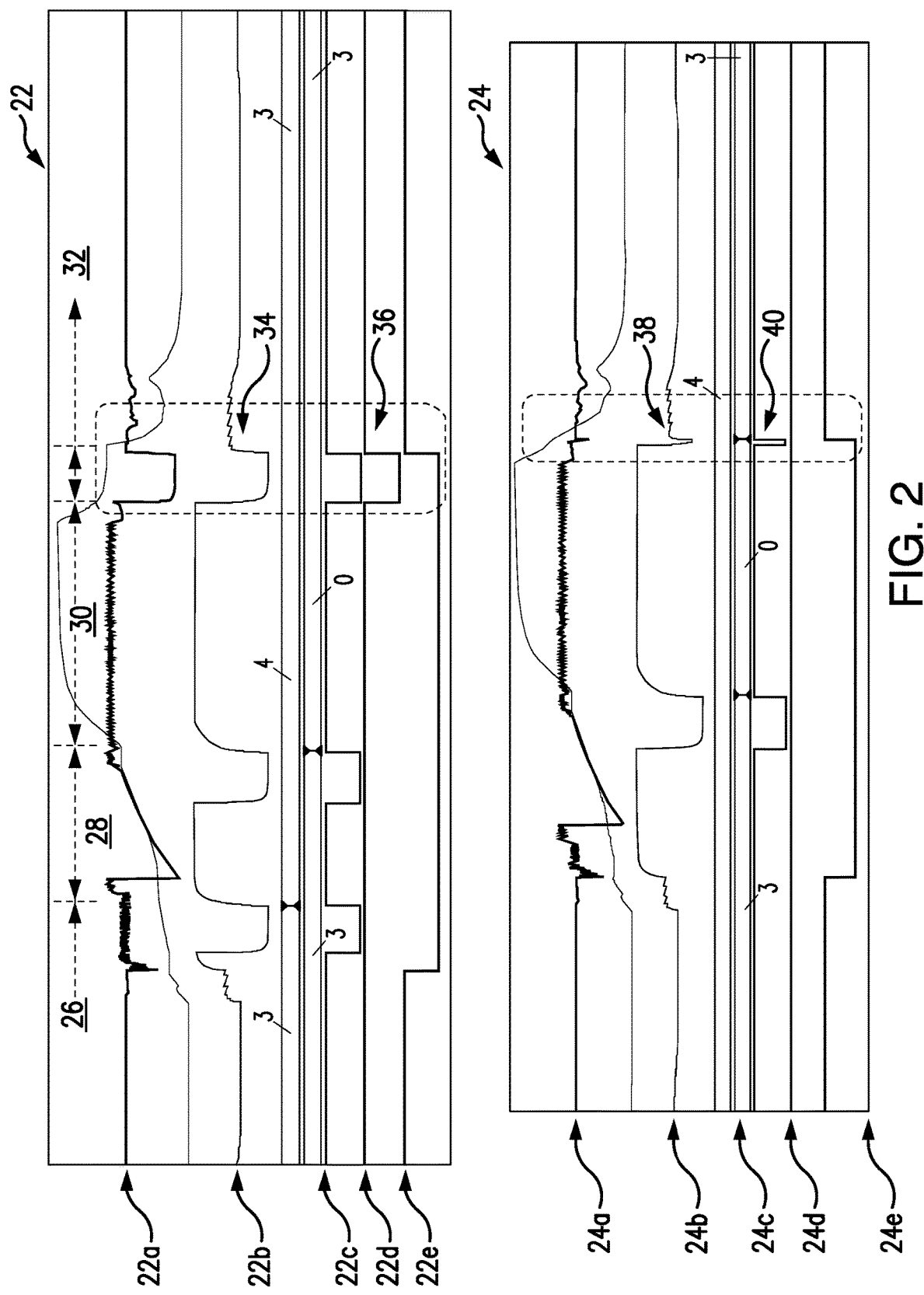
FIG. 2 is a comparative plot of an example of conventional pulse recovery phase waveforms and pulse recovery waveforms according to an embodiment.

FIG. 2 shows a conventional set 22 (22a-22e) of pulse recovery waveforms and an enhanced set 24 (24a-24e) of pulse recovery waveforms. In general, the waveforms define a verify previous period 26, an inhibit ramp period 28, a program pulse period 30, and a verify next period 32. The conventional set 22 includes a regulator verify voltage 22a, a program voltage 22b, a charge pump program enable signal 22c, a charge pump verify enable signal 22d, and a program completion signal 22e. A portion 34 of the program voltage 22b demonstrates that the conventional set 22 of pulse recovery waveforms discharge the program voltage 22b to zero/ground. Additionally, a portion 36 of the charge pump program enable signal 22c discharges and waits for a substantial amount of time (e.g., 2.5 µs).

The enhanced set 24 includes a regulator verify voltage 24a, a program voltage 24b, a charge pump program enable signal 24c, a charge pump verify enable signal 24d, and a program completion signal 24e. A portion 38 of the program voltage 24b demonstrates that the conventional set 22 of pulse recovery waveforms momentarily reduce the program voltage 24b to a non-zero voltage level. Additionally, a portion 40 of the charge pump program enable signal 24c discharges briefly and eliminates the wait time. Moreover, the charge pump verify enable signal 24d demonstrates that a discharge and charge of the pass/verify voltage are bypassed.

Table I below shows an overview of a conventional pulse recovery phase in which the wordlines are floated.

TABLE I

| Pulse | Pulse Recovery Phase (130 s) | | | | |
|---|---|---|---|---|---|
| End Vpgm ending | Vpass (Vpgm reset) | Float | Vpass reset | Vpass_BPN | Vpassr | Verify PV Starts |
| 0.9 µs | 3.01 µs | 2.5 µs (external power) | 5.35 µs | 0.7 µs | 1.2 µs |

Table II below shows an overview of an enhanced pulse recovery according to the technology described herein in which the wordlines are not floated.

| Pulse | Proposed Pulse Recovery Phase (140 s) | | | | |
|---|---|---|---|---|---|
| End Vpgm ending | Vpass (Vpgm reset) | Vpass reset | Vpass_BPN | Vpassr | Verify PV starts |
| 0.9 µs | 3.01 µs | 5.35 µs | 0.7 µs | 1.2 µs |

Figure 3:
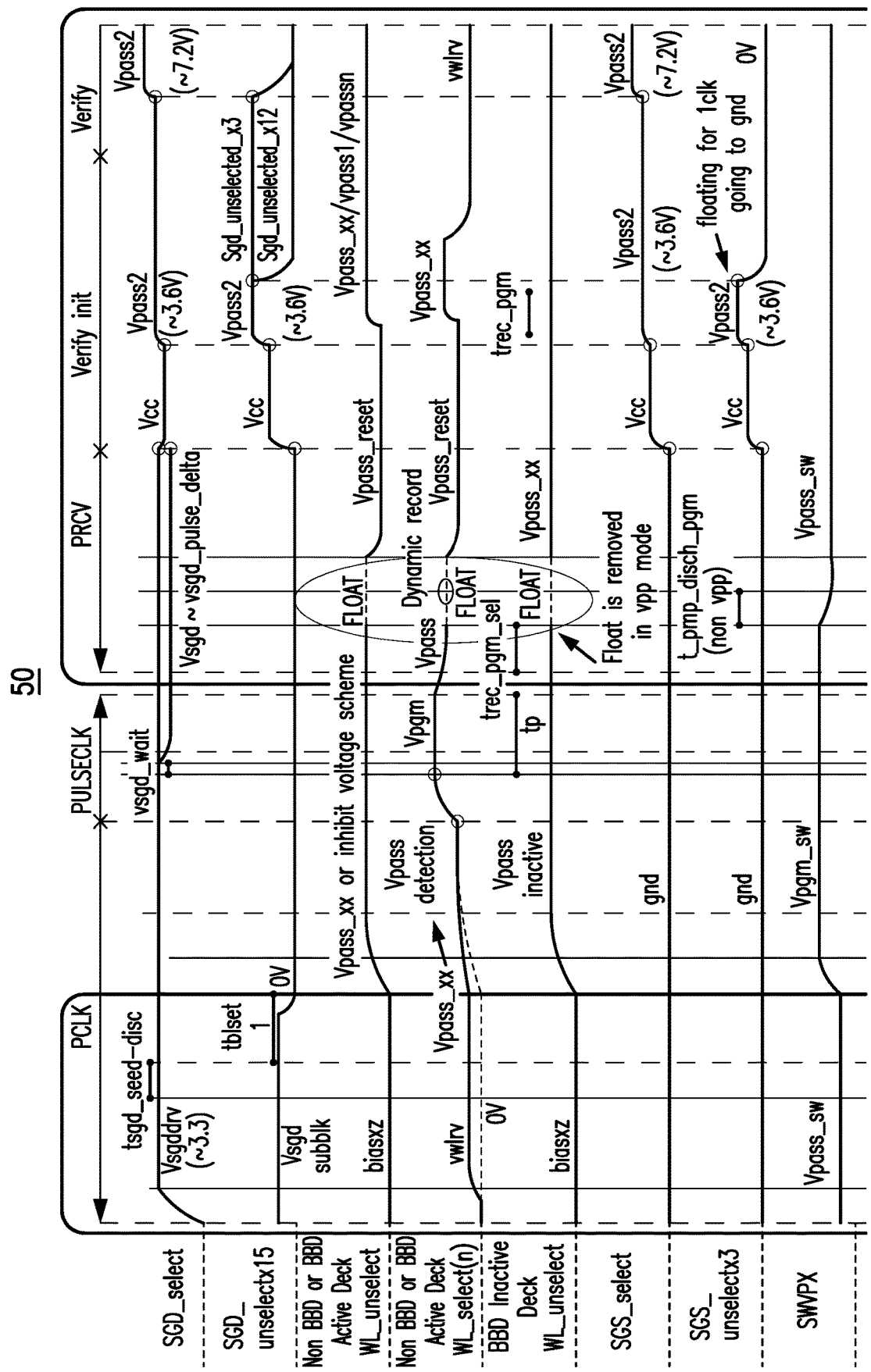
FIG. 3 is a plot of another example of a set of pulse recovery waveforms according to an embodiment.

FIG. 3 demonstrates a set of waveforms 50 in which all strings are disconnected from the nodes of a BL (e.g., all drain-side select gate/SGD transistors being off) and an appropriate voltage is applied to the nodes of the BL to distinguish between cells that are being programed and cells that are being inhibited during a program pulse ($V_{pgm}$). More particularly, a small voltage such as ground (GND) is applied to BLs being programmed, whereas a relatively large voltage (e.g., supply voltage $V_{cc}$), is applied to the BLs being inhibited.

Next, all WLs including selected and unselected WLs are brought to an intermediate voltage (e.g., $V_{pass}$), and the SGD transistors of the selected sub-block are turned on, while unselected SGDs are kept off. The voltage applied to the gate of the selected SGD may be chosen in a way that the transistor turns on if the BL is connected to ground and the transistor remains off if the BL is held at $V_{cc}$. At this moment, all strings that belong to unselected subblocks/SBs, as well as the strings from the selected subblock whose BL voltage is at $V_{cc}$ (e.g., SGD remains off) are floating, which causes the channel potential of the strings to follow $V_{pass}$. This state may be referred as the channel being "boosted". Moreover, $V_{pass}$ may be chosen to be large enough so that an inversion layer is formed for the strings that are connected to the BL (e.g., strings that belong to the selected SB and whose BL is at GND). The channel potential for the strings with the inversion layer is at GND. In practice, a slightly different $V_{pass}$ may be used for different WLs to control the potential profile along the channel and minimize program and inhibit disturbances.

Next, a relatively large voltage (e.g., $V_{pgm}$), is applied to the selected WL. For strings that are being programmed (e.g., selected SBs with BL at GND), the difference between $V_{pgm}$ and channel potential is large enough to cause significant Fowler-Nordheim (FN) tunneling (e.g., field electron tunneling from bulk metals) and program the cells. For other cells, the difference between gate voltage and channel potential is roughly ($V_{pgm}-V_{pass}$), causing the cells to not be programmed. A set of verify operations may then be performed to compare the threshold voltage of cells against predetermined verify voltages.

More particularly, after applying each program pulse, a verify operation sequence may be performed to determine if the threshold voltage of cells have passed the target verify voltage. If so, the cells may be given the inhibit designation for subsequent program pulses. As already noted, technology described herein maintains a connection between the selected wordlines and $V_{pass}$ during the program pulse-to-program verify transition. Such an approach reduces program time and reduces power. Moreover, embodiments conduct the $V_{pass}$ discharge by momentarily reducing the program voltage to a non-zero voltage level. Accordingly, the risk of an SOA violation is also reduced.

Figure 4:
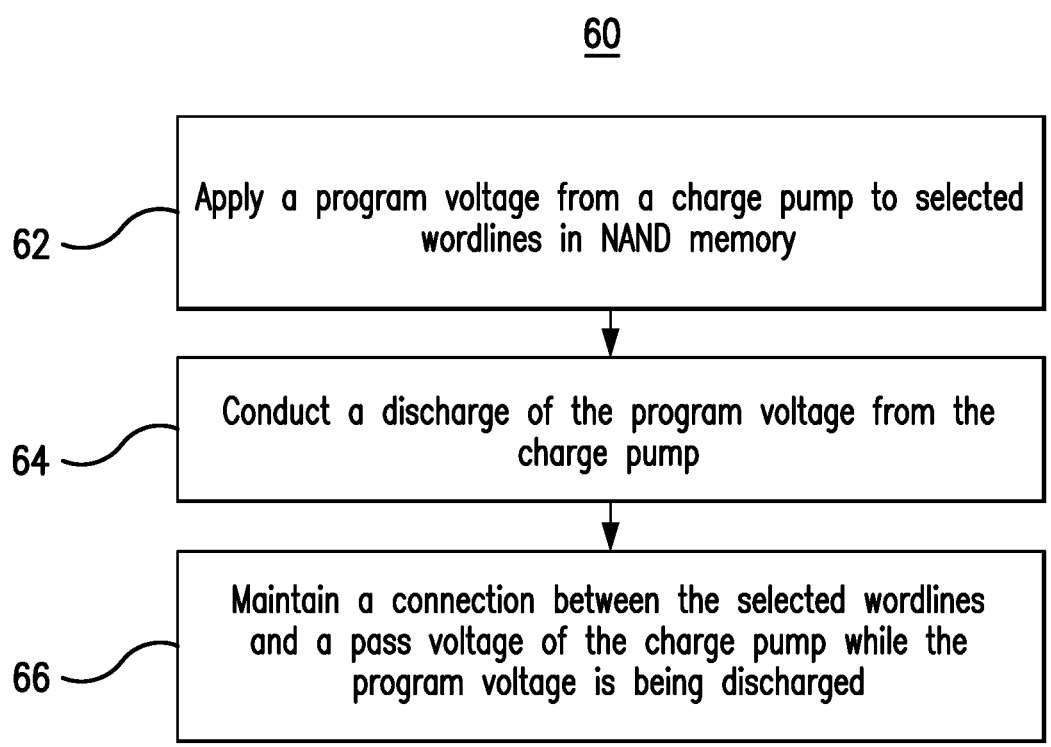
FIG. 4 is a flowchart of an example of a method of operating a memory chip controller according to an embodiment.

FIG. 4 shows a method 60 of operating a memory chip controller. The method 60 may be implemented in one or more modules as a set of logic instructions stored in a machine- or computer-readable storage medium such as random access memory (RAM), read only memory (ROM), programmable ROM (PROM), firmware, flash memory, etc., in hardware, or any combination thereof. For example, hardware implementations may include configurable logic, fixed-functionality logic, or any combination thereof. Examples of configurable logic include suitably configured programmable logic arrays (PLAs), field programmable gate arrays (FPGAs), complex programmable logic devices (CPLDs), and general purpose microprocessors. Examples of fixed-functionality logic include suitably configured application specific integrated circuits (ASICs), combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

Illustrated processing block 62 provides for applying a program voltage from a charge pump to selected wordlines in NAND memory. Additionally, block 64 conducts a discharge of the program voltage from the charge pump. In an embodiment, block 64 momentarily reduces the program voltage to a non-zero voltage level. In such a case, block 64 may include setting the non-zero voltage level via a control register. In one example, the discharge of the program voltage to the non-zero voltage level shortens a pulse recovery phase of the program voltage. Block 66 maintains a connection between the selected wordlines and a pass (e.g., verify) voltage of the charge pump while the program voltage is being discharged. In an embodiment, the connection between the selected wordlines and the pass voltage prevents the selected wordlines from floating. Additionally, block 66 may include bypassing a discharge and charge of the pass voltage. The method 60 therefore enhances performance at least to the extent that maintaining the connection between the selected wordlines and the pass voltage of the charge pump while the program voltage is being discharged reduces program time and/or power consumption.

Figure 5:
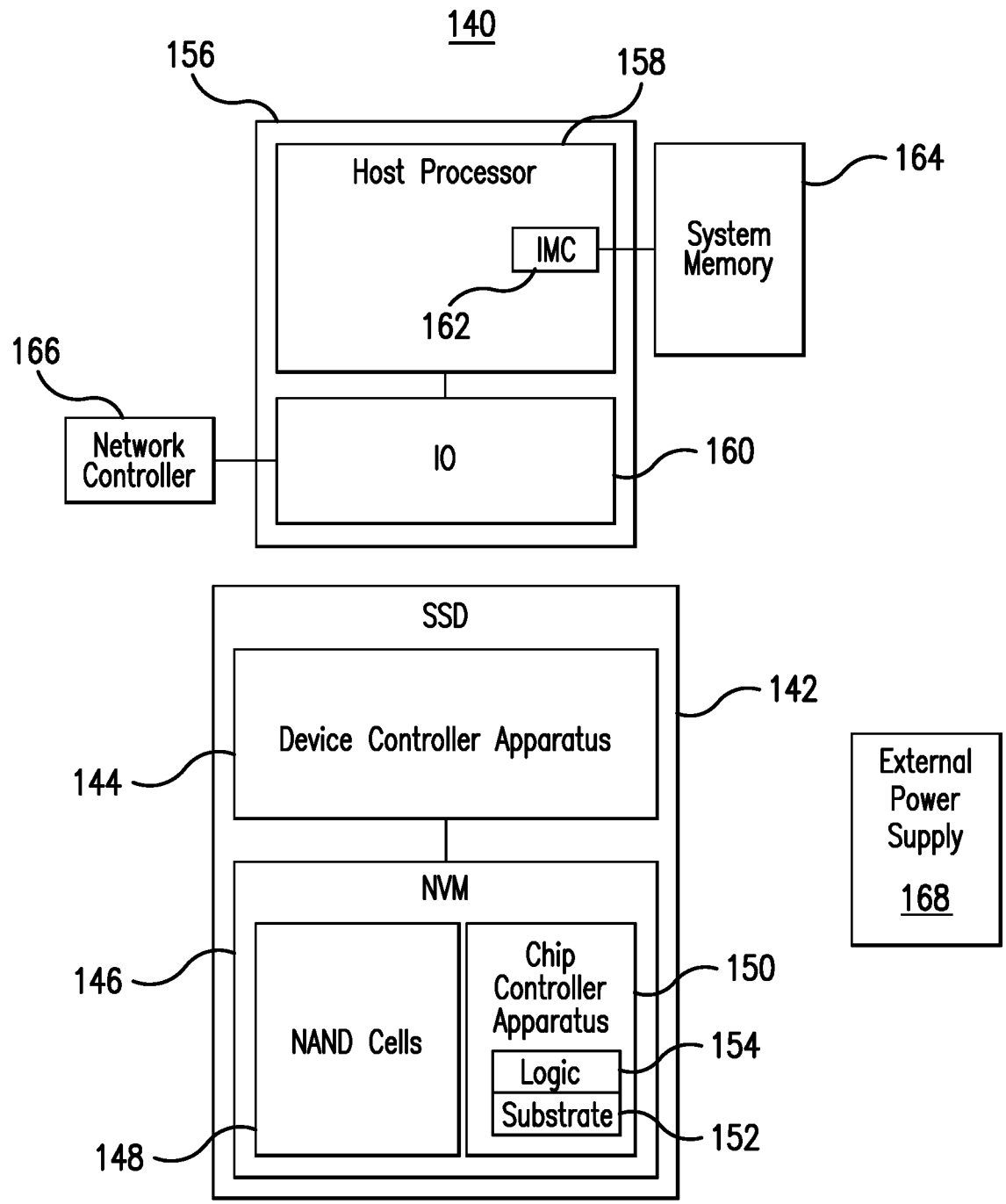
FIG. 5 is a block diagram of an example of a performance-enhanced computing system according to an embodiment.

Turning now to FIG. 5, a performance-enhanced computing system 140 is shown. In the illustrated example, a solid state drive (SSD) 142 includes a device controller apparatus 144 that is coupled to a non-volatile memory (NVM) 146. The illustrated NVM 146 includes a set of NAND cells 148 and a chip controller apparatus 150 that includes a substrate 152 (e.g., silicon, sapphire, gallium arsenide) and logic 154 (e.g., transistor array and other integrated circuit/IC components) coupled to the substrate 152. The logic 154, which may include one or more of configurable or fixed-functionality hardware, may be configured to perform one or more aspects of the method 60 (FIG. 4), already discussed.

More particularly, the logic 154 may include a charge pump such as, for example, the charge pump 10 (FIG. 1), wherein the logic 154 is to apply a program voltage from the charge pump to selected word lines in the NAND cells 148, conduct a discharge of the program voltage from the charge pump, and maintain a connection between the selected wordlines and a pass voltage of the charge pump while the program voltage is being discharged. Additionally, the charge pump may be coupled to an external power supply 168 during the pulse recovery phase. The computing system 140 is therefore performance-enhanced at least to the extent that maintaining the connection between the selected wordlines and the pass voltage of the charge pump while the program voltage is being discharged reduces program time and/or power consumption.

The illustrated system 140 also includes a system on chip (SoC) 156 having a host processor 158 (e.g., central processing unit/CPU) and an input/output (TO) module 160. The host processor 158 may include an integrated memory controller 162 (IMC) that communicates with system memory 164 (e.g., RAM dual inline memory modules/DIMMs). The illustrated IO module 160 is coupled to the SSD 142 as well as other system components such as a network controller 166.

In one example, the logic 154 includes transistor channel regions that are positioned (e.g., embedded) within the substrate 152. Thus, the interface between the logic 154 and the substrate 152 may not be an abrupt junction. The logic 154 may also be considered to include an epitaxial layer that is grown on an initial wafer of the substrate 152.

Additional Notes and Examples

Example 1 includes a memory chip controller comprising one or more substrates and logic coupled to the one or more substrates, wherein the logic includes a charge pump, and wherein the logic is implemented at least partly in one or more of configurable or fixed-functionality hardware, the logic to apply a program voltage from the charge pump to selected wordlines in NAND memory, conduct a discharge of the program voltage from the charge pump, and maintain a connection between the selected wordlines and a pass voltage of the charge pump while the program voltage is being discharged.

Example 2 includes the memory chip controller of Example 1, wherein the connection between the selected wordlines and the pass voltage is to prevent the selected wordlines from floating.

Example 3 includes the memory chip controller of Example 1, wherein the discharge is to momentarily reduce the program voltage to a non-zero voltage level.

Example 4 includes the memory chip controller of Example 3, wherein the logic is to set the non-zero voltage level via a control register.

Example 5 includes the memory chip controller of Example 3, wherein the discharge of the program voltage to the non-zero voltage level is to shorten a pulse recovery phase of the program voltage.

Example 6 includes the memory chip controller of any one of Examples 1 to 5, wherein the logic is to bypass a discharge and charge of the pass voltage.

Example 7 includes the memory chip controller of any one of Examples 1 to 6, wherein the charge pump is to be coupled to an external power supply.

Example 8 includes a performance-enhanced computing system comprising a NAND memory, and a memory chip controller including logic coupled to one or more substrates, wherein the logic includes a charge pump, the logic to apply a program voltage from the charge pump to selected wordlines in the NAND memory, conduct a discharge of the program voltage from the charge pump, and maintain a connection between the selected wordlines and a pass voltage of the charge pump while the program voltage is being discharged.

Example 9 includes the computing system of Example 8, wherein the connection between the selected wordlines and the pass voltage is to prevent the selected wordlines from floating.

Example 10 includes the computing system of Example 8, wherein the discharge momentarily reduces the program voltage to a non-zero voltage level.

Example 11 includes the computing system of Example 10, wherein the logic is to set the non-zero voltage level via a control register.

Example 12 includes the computing system of Example 10, wherein the discharge of the program voltage to the non-zero voltage level is to shorten a pulse recovery phase of the program voltage.

Example 13 includes the computing system of any one of Examples 8 to 12, wherein the logic is to bypass a discharge and charge of the pass voltage.

Example 14 includes the computing system of any one of Examples 8 to 13, wherein the charge pump is to be coupled to an external power supply.

Example 15 includes a method of operating a memory chip controller, the method comprising applying a program voltage from a charge pump to selected wordlines in NAND memory, conducting a discharge of the program voltage from the charge pump, and maintaining a connection between the selected wordlines and a pass voltage of the charge pump while the program voltage is being discharged.

Example 16 includes the method of Example 15, wherein the connection between the selected wordlines and the pass voltage prevents the selected wordlines from floating.

Example 17 includes the method of Example 15, wherein the discharge momentarily reduces the program voltage to a non-zero voltage level.

Example 18 includes the method of Example 17, further including setting the non-zero voltage level via a control register.

Example 19 includes the method of Example 17, wherein the discharge of the program voltage to the non-zero voltage level shortens a pulse recovery phase of the program voltage.

Example 20 includes the method of any one of Examples 15 to 19, further including bypassing a discharge and charge of the pass voltage.

Example 21 includes an apparatus comprising means for performing the method of any one of Examples 15 to 20.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory chip controller comprising:
one or more substrates; and
logic coupled to the one or more substrates, wherein the logic includes a charge pump, and wherein the logic is implemented at least partly in one or more of configurable or fixed-functionality hardware, the logic to:
apply a program voltage from the charge pump to selected wordlines in NAND memory;
conduct a discharge of the program voltage from the charge pump; and
maintain a connection between the selected wordlines and a pass voltage of the charge pump while the program voltage is being discharged.

2. The memory chip controller of claim 1, wherein the connection between the selected wordlines and the pass voltage is to prevent the selected wordlines from floating.

3. The memory chip controller of claim 1, wherein the discharge is to momentarily reduce the program voltage to a non-zero voltage level.

4. The memory chip controller of claim 3, wherein the logic is to set the non-zero voltage level via a control register.

5. The memory chip controller of claim 3, wherein the discharge of the program voltage to the non-zero voltage level is to shorten a pulse recovery phase of the program voltage.

6. The memory chip controller of claim 1, wherein the logic is to bypass a discharge and charge of the pass voltage.

7. The memory chip controller of claim 1, wherein the charge pump is to be coupled to an external power supply.

8. A computing system comprising:
a NAND memory; and
a memory chip controller including logic coupled to one or more substrates, wherein the logic includes a charge pump, the logic to:
apply a program voltage from the charge pump to selected wordlines in the NAND memory,
conduct a discharge of the program voltage from the charge pump, and
maintain a connection between the selected wordlines and a pass voltage of the charge pump while the program voltage is being discharged.

9. The computing system of claim 8, wherein the connection between the selected wordlines and the pass voltage is to prevent the selected wordlines from floating.

10. The computing system of claim 8, wherein the discharge momentarily reduces the program voltage to a non-zero voltage level.

11. The computing system of claim 10, wherein the logic is to set the non-zero voltage level via a control register.

12. The computing system of claim 10, wherein the discharge of the program voltage to the non-zero voltage level is to shorten a pulse recovery phase of the program voltage.

13. The computing system of claim 8, wherein the logic is to bypass a discharge and charge of the pass voltage.

14. The computing system of claim 8, wherein the charge pump is to be coupled to an external power supply.

15. A method comprising:
applying a program voltage from a charge pump to selected wordlines in NAND memory;
conducting a discharge of the program voltage from the charge pump; and
maintaining a connection between the selected wordlines and a pass voltage of the charge pump while the program voltage is being discharged.

16. The method of claim 15, wherein the connection between the selected wordlines and the pass voltage prevents the selected wordlines from floating.

17. The method of claim 15, wherein the discharge momentarily reduces the program voltage to a non-zero voltage level.

18. The method of claim 17, further including setting the non-zero voltage level via a control register.

19. The method of claim 17, wherein the discharge of the program voltage to the non-zero voltage level shortens a pulse recovery phase of the program voltage.

20. The method of claim 15, further including bypassing a discharge and charge of the pass voltage.

* * * * *